(12) United States Patent
Yen et al.

(10) Patent No.: US 11,557,535 B2
(45) Date of Patent: Jan. 17, 2023

(54) SEMICONDUCTOR DEVICE AND METAL-OXIDE-SEMICONDUCTOR CAPACITOR STRUCTURE

(71) Applicant: Realtek Semiconductor Corporation, Hsinchu (TW)

(72) Inventors: Hsiao-Tsung Yen, Hsinchu (TW); Ka-Un Chan, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 11 days.

(21) Appl. No.: 17/034,207

(22) Filed: Sep. 28, 2020

(65) Prior Publication Data
US 2022/0020684 A1  Jan. 20, 2022

(30) Foreign Application Priority Data
Jul. 17, 2020  (TW) .................. 109124319

(51) Int. Cl.
*H01L 23/52* (2006.01)
*H01L 23/522* (2006.01)
(Continued)

(52) U.S. Cl.
CPC ...... *H01L 23/5222* (2013.01); *H01L 23/5223* (2013.01); *H01L 23/5225* (2013.01); *H01L 23/5226* (2013.01); *H01L 23/642* (2013.01); *H01L 27/016* (2013.01); *H01L 27/3265* (2013.01); *H01L 27/3272* (2013.01); *H01L 28/40* (2013.01); *H01L 29/94* (2013.01)

(58) Field of Classification Search
CPC ............. H01L 23/5222; H01L 23/5223; H01L 23/5225; H01L 23/5226; H01L 23/642; H01L 27/016; H01L 27/3265; H01L 27/3272; H01L 28/40; H01L 29/94; H01L 28/10; H01L 28/60
See application file for complete search history.

(56) References Cited

U.S. PATENT DOCUMENTS

2006/0061935 A1\* 3/2006 Schultz ............... H01L 23/5223
361/306.1
2008/0129911 A1\* 6/2008 Huang ............... G02F 1/136209
257/E27.113
(Continued)

FOREIGN PATENT DOCUMENTS

JP    2005150717 A * 6/2005 ....... H01L 21/76898
TW       503439 B    9/2002
TW      I692787 B    5/2020

OTHER PUBLICATIONS

U.S. Appl. No. 16/830,648, filed Mar. 26, 2020.

*Primary Examiner* — Shouxiang Hu
(74) *Attorney, Agent, or Firm* — Locke Lord LLP; Tim Tingkang Xia, Esq.

(57) ABSTRACT

A semiconductor device is disposed below an inductor. The semiconductor device includes a metal-oxide-semiconductor capacitor structure and a patterned shielding structure. The metal-oxide-semiconductor capacitor structure includes a polysilicon layer, an oxide definition layer, and a first metal layer. The first metal layer is connected to the polysilicon layer and the oxide definition layer. The patterned shielding structure is disposed over the metal-oxide-semiconductor capacitor structure and includes a second metal layer.

13 Claims, 6 Drawing Sheets

(51) Int. Cl.
*H01L 29/94* (2006.01)
*H01L 23/64* (2006.01)
*H01L 27/01* (2006.01)
*H01L 27/32* (2006.01)
*H01L 49/02* (2006.01)

(56) References Cited

U.S. PATENT DOCUMENTS

2008/0311749 A1* 12/2008 Savastiouk ....... H01L 23/49822
257/E23.079
2015/0123244 A1* 5/2015 Yen ..................... H01L 28/60
257/534

\* cited by examiner

SEMICONDUCTOR DEVICE AND METAL-OXIDE-SEMICONDUCTOR CAPACITOR STRUCTURE

RELATED APPLICATIONS

This application claims priority to Taiwanese Application Serial Number 109124319, filed Jul. 17, 2020, which is herein incorporated by reference.

BACKGROUND

Technical Field

The present disclosure relates to a semiconductor technology. More particularly, the present disclosure relates to a metal-oxide-semiconductor capacitor (MOSCAP) structure and a semiconductor device having the MOSCAP structure.

Description of Related Art

With development of semiconductors, metal-oxide-semiconductor capacitor (MOSCAP) structures are used in various circuitries. However, the MOSCAP structures in some related approaches have many drawbacks, and these drawbacks cause that the quality factor values (Q value) of semiconductor devices to be worse.

SUMMARY

One embodiment of the present disclosure is related to a semiconductor device. The semiconductor device is disposed below an inductor. The semiconductor device includes a metal-oxide-semiconductor capacitor (MOSCAP) structure and a patterned shielding structure. The metal-oxide-semiconductor capacitor structure includes a polysilicon layer, an oxide definition layer, and a first metal layer. The first metal layer is connected to the polysilicon layer and the oxide definition layer. The patterned shielding structure is disposed over the metal-oxide-semiconductor capacitor structure and includes a second metal layer.

One embodiment of the present disclosure is related to a MOSCAP structure. The MOSCAP structure is disposed below a patterned shielding structure. The MOSCAP structure includes a polysilicon layer, an oxide definition layer, and a first metal layer. The first metal layer is connected to the polysilicon layer through a first connection via, and is connected to the oxide definition layer through a second connection via. The patterned shielding structure includes a second metal layer, and the first metal layer is connected to the second metal layer through a third connection via.

As shown in the above embodiments, the semiconductor device of the present disclosure can utilize two metal layers to implement the MOSCAP structure and the patterned shielding structure, and can increase the quality factor value.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
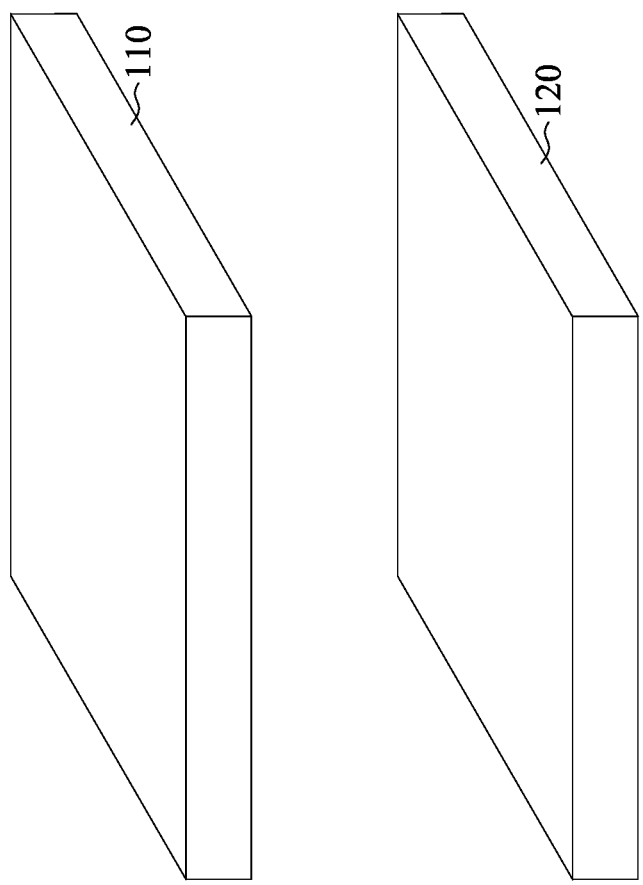
FIG. 1 is a schematic diagram illustrating an inductor and a semiconductor device according to some embodiments of the present disclosure.
Figure 1:
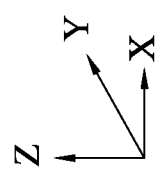

Reference is now made in detail to the present embodiments of the disclosure, examples of which are illustrated in the accompanying drawings. Wherever possible, the same reference numbers are used in the drawings and the description to refer to the same or like parts. The embodiments below are described in detail with the accompanying drawings, but the examples provided are not intended to limit the scope of the disclosure covered by the description. The structure and operation are not intended to limit the execution order. Any structure regrouped by elements, which has an equal effect, is covered by the scope of the present disclosure. In addition, the drawings are for illustrative purposes only, and are not drawn according to the original sizes. To facilitate understanding, the same or similar elements in the following description will be described with the same symbols.

It will be understood that, although the terms first, second, third etc. may be used in the present disclosure to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Reference is made to FIG. 1. FIG. 1 is a schematic diagram illustrating an inductor 110 and a semiconductor device 120 according to some embodiments of the present disclosure. As illustrated in FIG. 1, the semiconductor device 120 is disposed below the inductor 110.

Figure 2:
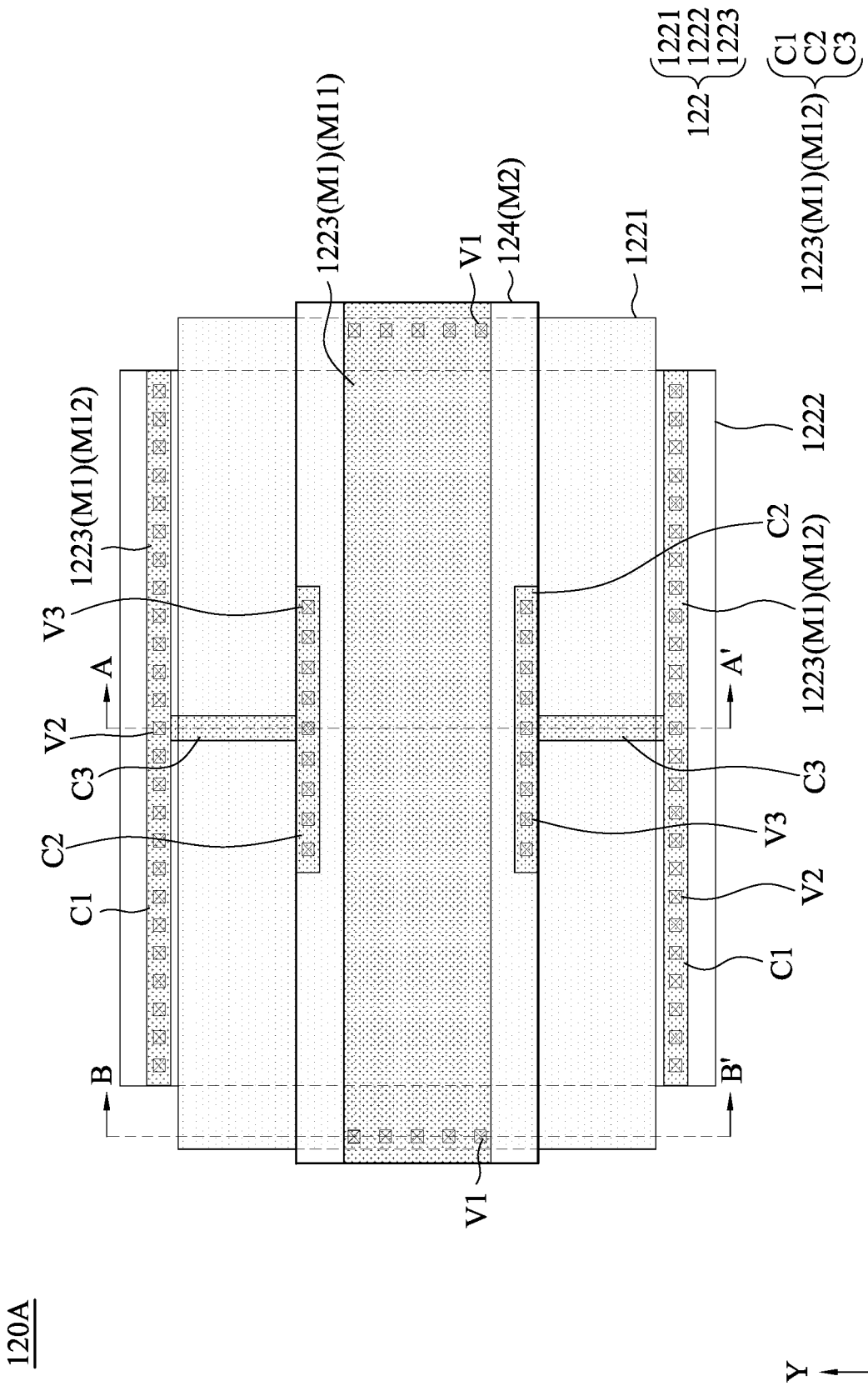
FIG. 2 is a schematic diagram illustrating a semiconductor device according to some embodiments of the present disclosure.
Figure 3:
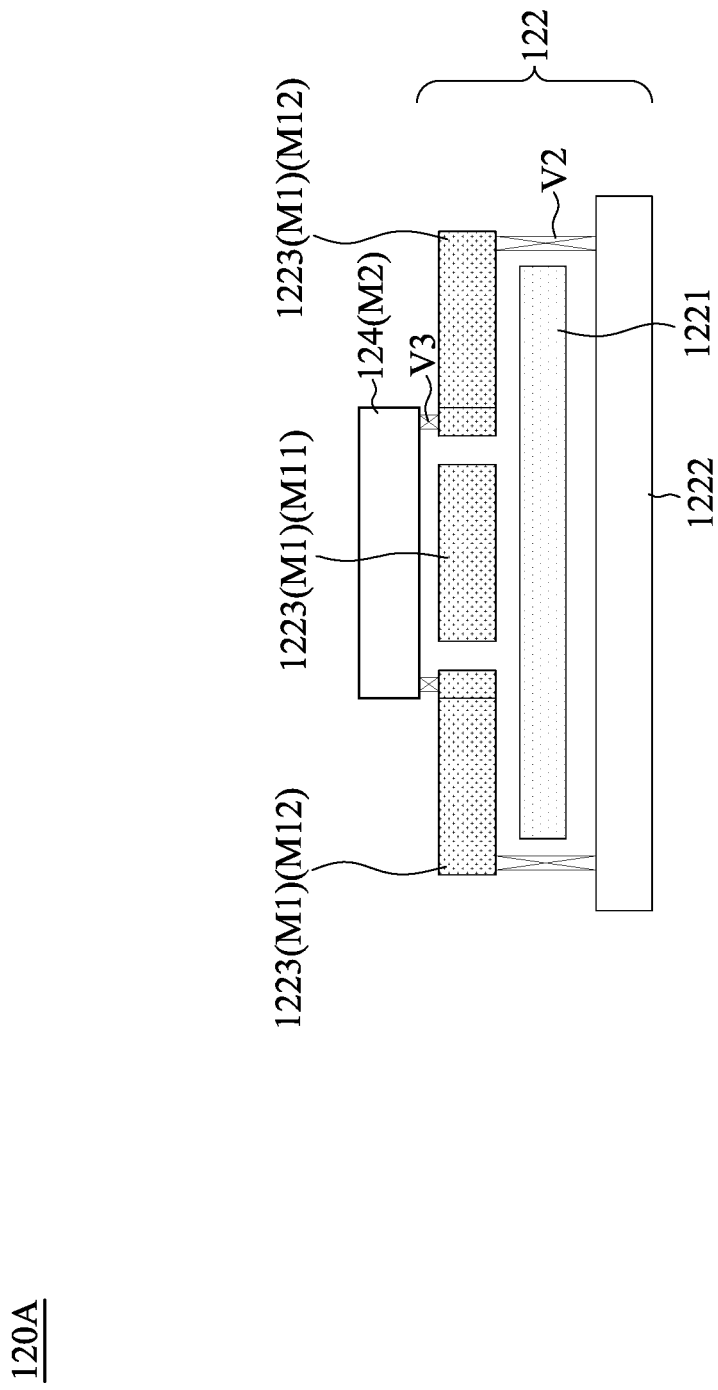
FIG. 3 is a section diagram corresponding to a section line in FIG. 2 according to some embodiments of the present disclosure.
Figure 4:
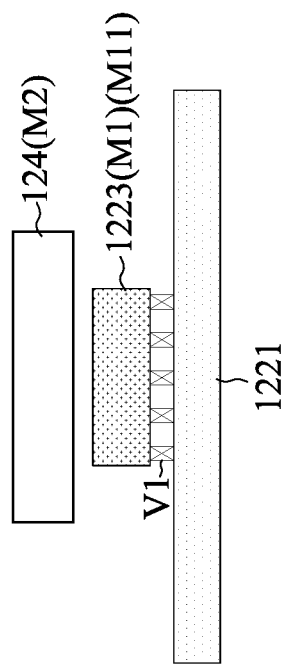
FIG. 4 is a section diagram corresponding to a section line in FIG. 2 according to some embodiments of the present disclosure.

References are made to FIG. 2, FIG. 3, and FIG. 4. FIG. 2 is a schematic diagram illustrating a semiconductor device 120A according to some embodiments of the present disclosure. FIG. 3 is a section diagram corresponding to a section line AA' in FIG. 2 according to some embodiments of the present disclosure. FIG. 4 is a section diagram corresponding to a section line BB' in FIG. 2 according to some embodiments of the present disclosure. In some embodiments, the semiconductor device 120A in FIG. 2 is configured to implement the semiconductor device 120 in FIG. 1.

The semiconductor device 120A includes a metal-oxide-semiconductor capacitor (MOSCAP) structure 122 and a patterned shielding structure 124. The patterned shielding structure 124 is disposed over the MOSCAP structure 122.

To be more specific, the MOSCAP structure 122 includes a polysilicon layer 1221, an oxide definition (OD) layer 1222, a first metal layer 1223 (for example, M1 layer, hereafter "the first metal layer M1"), multiple connection vias V1, and multiple connection vias V2. The polysilicon layer 1221 is disposed over the OD layer 1222. The first metal layer 1223 is disposed over the polysilicon layer 1221.

The patterned shielding structure 124 is disposed over the first metal layer 1223. The patterned shielding structure 124 may be implemented by a second metal layer (for example, M2 layer, hereafter "the second metal layer M2").

In some related approaches, an eddy current is generated on a semiconductor device due to a magnetic field generated when an inductor disposed over the semiconductor device operates. The eddy current affects a quality factor value (Q value) of the inductor.

Compared to these related approaches, the semiconductor device 120A of the present disclosure includes the patterned shielding structure 124. In some embodiments, the patterned shielding structure 124 may be connected to the ground. The patterned shielding structure 124 avoids forming a closed loop in order to reduce mutual inductance in the inductor 110, to prevent the semiconductor device 120A from generating the aforementioned eddy current, such that the Q value of the inductor 110 can be maintained effectively.

In addition, in some other related approaches, MOSCAP structure is implemented by at least three metal layers.

Compared to these related approaches, the MOSCAP structure 122 of the present disclosure is implemented by only two metal layers (the first metal layer M1 and the second metal layer M2). Accordingly, the MOSCAP structure 122 of the present disclosure has advantages of low cost and a simpler structure.

Reference is made to FIG. 3 again. The first metal layer M1 includes a first conductive component M11 and at least one second conductive component M12. In this example in FIG. 3, the first metal layer M1 includes two second conductive components M12. The first conductive component M11 is configured to receive a first voltage. The second metal layer M2 is configured to receive a second voltage. The second voltage is different from the first voltage. For example, the first voltage is greater than the second voltage. In some embodiments, the first voltage is a positive voltage, and the second voltage is a ground voltage.

Reference is made to FIG. 4 again. The first conductive component M11 is connected to the polysilicon layer 1221 through the first connection vias V1. Reference is made to FIG. 3 again. The OD layer 1222 is connected to the second conductive components M12 of the first metal layer M1 through the second connection vias V2. The second conductive components M12 of the first metal layer M1 is connected to the second metal layer M2 through third connection vias V3. Since the OD layer 1222 is connected to the second conductive components M12 and the second metal layer M2, voltage levels of the OD layer 1222, the second conductive components M12, and the second metal layer M2 are the same.

Reference is made to FIG. 2 again. A projection area, on a plane formed by a direction X and a direction Y, of the first conductive component M11 of the first metal layer M1, is within a projection area, on the plane formed by the direction X and the direction Y, of a the second metal layer M2. In other words, the projection area, on the plane formed by the direction X and the direction Y, of the first conductive component M11 of the first metal layer M1, is less than the projection area, on the plane formed by the direction X and the direction Y, of the second metal layer M2. The direction X and the direction Y are perpendicular to a direction Z.

The second conductive components M12 are H-shaped. To be more specific, each of the second conductive components M12 includes a first conductive segment C1, a second conductive segment C2, a third conductive segment C3. The first conductive segment C1 is connected to the OD layer 1222 through the second connection vias V2. The second conductive segment C2 is connected to the second metal layer M2 through the third connection vias V3. The third conductive segment C3 is connected to the first conductive segment C1 and the second conductive segment C2. The third conductive segment C3 is perpendicular to the first conductive segment C1 and the second conductive segment C2. The first conductive segment C1 is parallel to the second conductive segment C2. The first conductive segment C1 and the second conductive segment C2 extend toward the direction X. The third conductive segment C3 extends toward the direction Y.

In some related approaches, a capacitance value of the MOSCAP structure is greater and the MOSCAP structure has more loops. These are not unfavorable for the Q value of the MOSCAP structure.

Compared to theses related approaches, in the embodiments in FIG. 2, the capacitance value (for example, parasitic capacitance value) can be reduced and the loops can be reduced to increase the Q value since the each of the second conductive components M12 is implemented by multiple conductive segments, and an overlapped region of a projection area, on the plane formed by the direction X and the direction Y, of the second conductive components M12 and a projection area, on the plane formed by the direction X and the direction Y, of the polysilicon layer 1221 is less (only the second conductive segment C2 and the third conductive segment C3 are overlapped with the polysilicon layer 1221).

In the example in FIG. 2, a length of the first conductive segment C1 is greater than a length of the second conductive segment C2. In some other embodiments, the length of the first conductive segment C1 is equal to or less than the length of the second conductive segment C2.

As illustrated in FIG. 2, a connection direction of the first connection vies V1 on the left side of FIG. 2 is the same to the direction Y. A connection direction of the second connection vias V2 on the up side of FIG. 2 is the same to the direction X. The direction Y is perpendicular to the direction X. In other words, the connection direction of the first connection vias V1 on the left side of FIG. 2 is perpendicular to the connection direction of the second connection vias V2 on the up side of FIG. 2. The second connection vias V2 on the top side of FIG. 2 and the second connection vias V2 on the low side of FIG. 2 are disposed at two sides of the polysilicon layer 1221 respectively.

As illustrated in FIG. 2, the connection direction of the first connection vias V1 on the left side of FIG. 2 is the same to the direction Y. A connection direction of the third connection vias V3 on the up side of FIG. 2 is the same to the direction X. The direction Y is perpendicular to the direction X. In other words, the connection direction of the first connection vias V1 on the left side of FIG. 2 is perpendicular to the connection direction of the third connection vias V3 on the up side of FIG. 2.

It is noted that, the quantity of the first connection vias V1, the quantity of the second connection vias V2, and the quantity of the third connection vias V3 in FIG. 2 are only for illustration, and various quantities are within the contemplated scopes of the present disclosure.

In some embodiments, multiple semiconductor devices 120A in FIG. 2 are repeated along a direction and connected. For example, multiple semiconductor devices 120A in FIG. 2 are repeated along the direction X and connected to form a larger semiconductor device and can be used in applications requiring a larger size.

Figure 5:
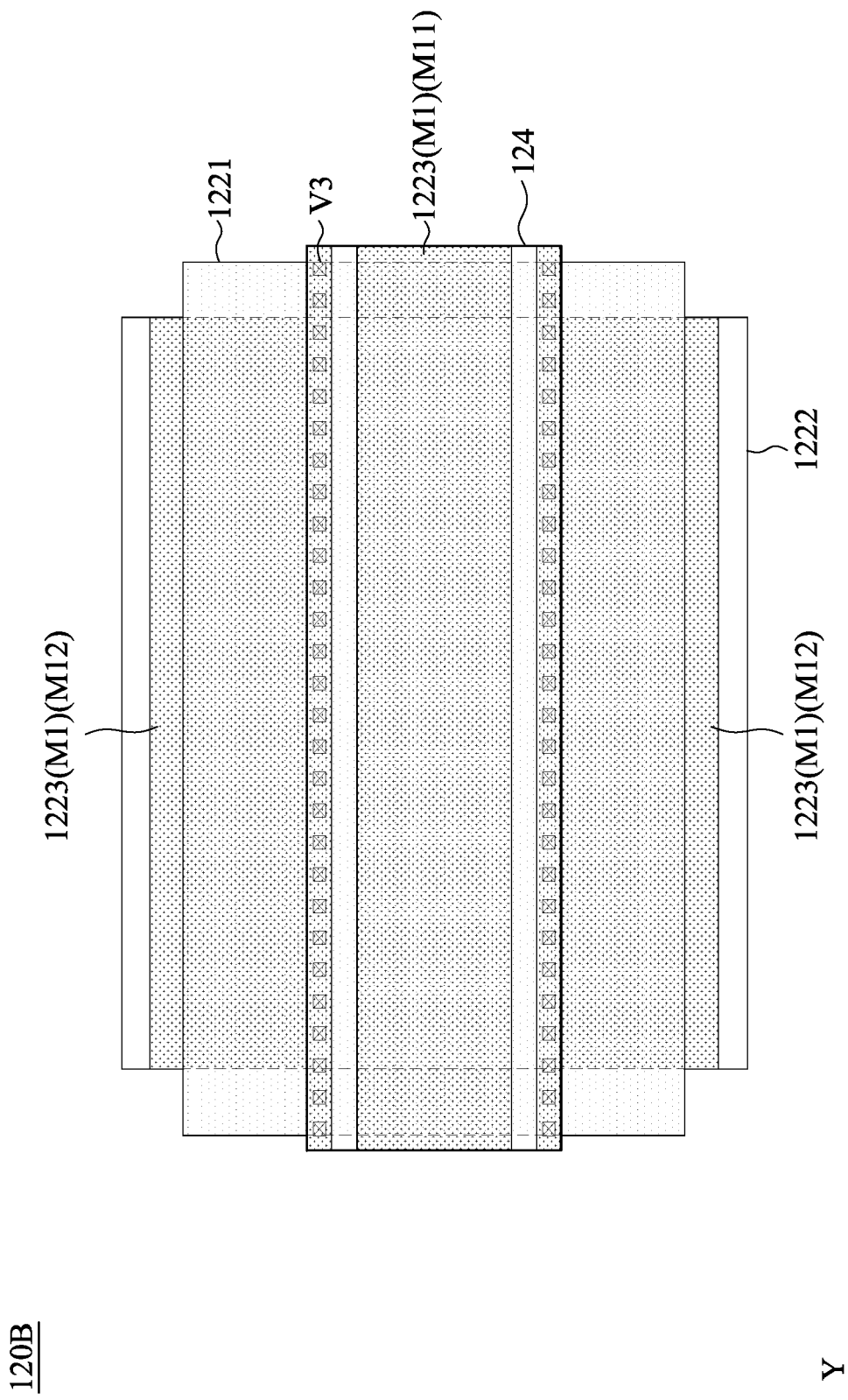
FIG. 5 is a schematic diagram illustrating a semiconductor device according to some embodiments of the present disclosure.

Reference is made to FIG. 5. FIG. 5 is a schematic diagram illustrating a semiconductor device 120B according to some embodiments of the present disclosure. A main difference between the semiconductor device 120B in FIG. 5 and the semiconductor device 120A in FIG. 2 is that, the second conductive components M12 of the first metal layer M1 of the semiconductor device 120B in FIG. 5 are rectangular. In the example of FIG. 5, the capacitance value is greater since the second conductive components M12 are rectangular, and the overlapped region of the projection area, on the plane formed by the direction X and the direction Y, of the second conductive components M12 and the projection area, on the plane formed by the direction X and the direction Y, of the polysilicon layer 1221 is greater. In addition, the capacitance value between the first conductive component M11 and the second conductive components M12 is greater. Accordingly, the semiconductor device 120B in FIG. 5 can be used in applications requiring a larger size.

In some embodiments, multiple semiconductor devices 120B in FIG. 5 are repeated along a direction and connected. For example, multiple semiconductor devices 120B in FIG. 5 are repeated along the direction X and connected to form a larger semiconductor device and can be used in applications requiring a larger size.

Figure 6:
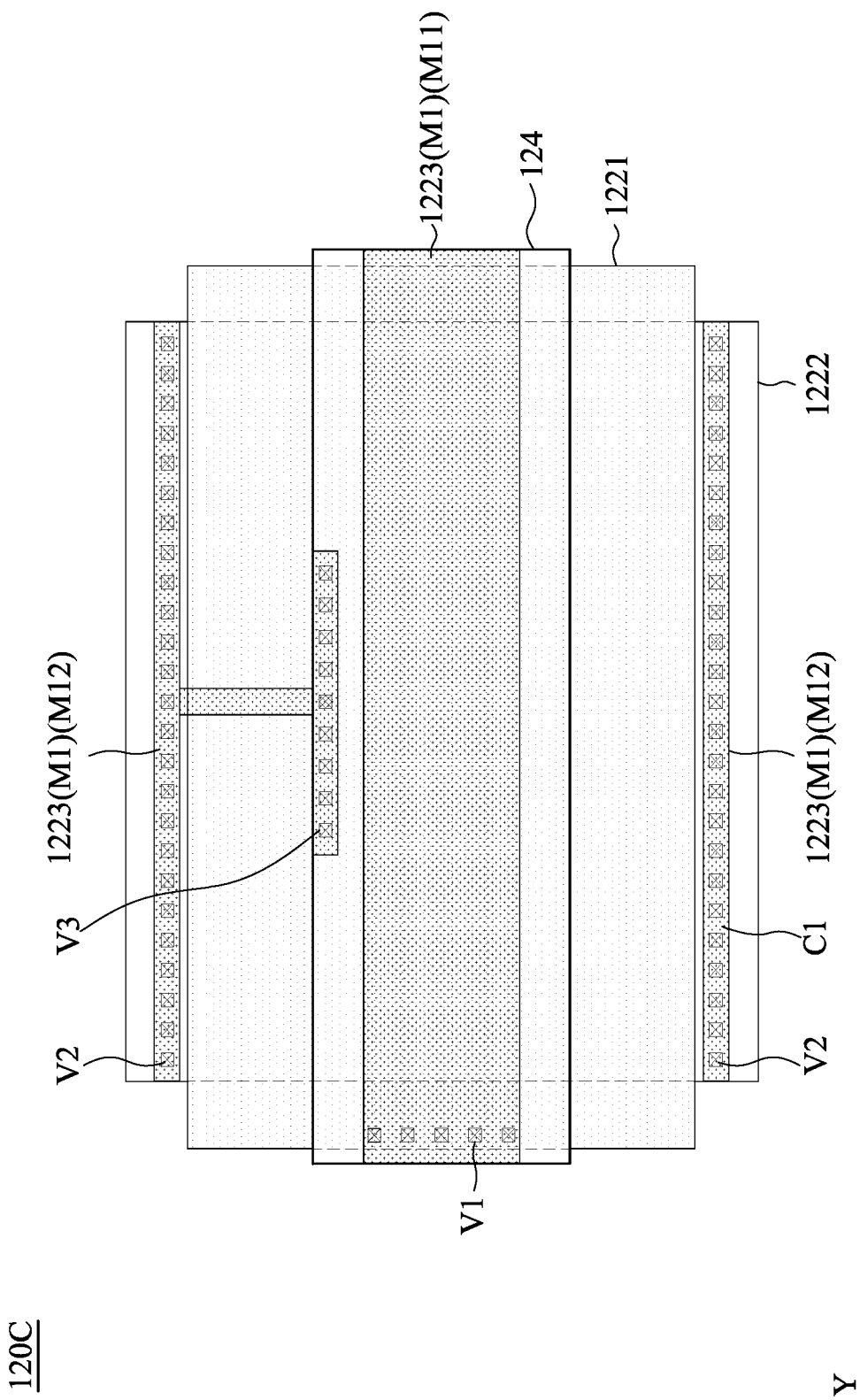
FIG. 6 is a schematic diagram illustrating a semiconductor device according to some embodiments of the present disclosure.

Reference is made to FIG. 6. FIG. 6 is a schematic diagram illustrating a semiconductor device 120C according to some embodiments of the present disclosure. One of main differences between the semiconductor device 120C in FIG. 6 and the semiconductor device 120A in FIG. 2 is that, the semiconductor device 120C in FIG. 6 includes the first connection vias V1 on the left side of FIG. 2 and does not include the first connection vias V1 on the right side of FIG. 2. In addition, one of the main differences between the semiconductor device 120C in FIG. 6 and the semiconductor device 120A in FIG. 2 is that, the second conductive component M12 on the low side of FIG. 6 only includes the first conductive segment C1 and does not include the second conductive segment C2, the third conductive segment C3, and the third connection vias V3 on the low side of FIG. 2.

In the embodiment in FIG. 6, the capacitance value (for example, parasitic capacitance value) can be reduced more effectively and the loops can be reduced more effectively to increase the Q value since an overlapped region of the projection area, on the plane formed by the direction X and the direction Y, of the second conductive components M12 and the projection area, on the plane formed by the direction X and the direction Y, of the polysilicon layer 1221 is less (lack of the overlapped region of the second conductive segment C2/the third conductive segment C3 on the low side of FIG. 2 and the polysilicon layer 1221).

In some embodiments, multiple semiconductor devices 120C in FIG. 6 are repeated along a direction and connected. For example, multiple semiconductor devices 120C in FIG. 6 are repeated along the direction X and connected to form a larger semiconductor device and can be used in applications requiring a larger size.

As shown in the above embodiments, the semiconductor device of the present disclosure can utilize two metal layers to implement the MOSCAP structure and the patterned shielding structure, and can increase the quality factor value.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A semiconductor device disposed below an inductor, wherein the semiconductor device comprises:
   a metal-oxide-semiconductor capacitor (MOSCAP) structure comprising:
   a polysilicon layer;
   an oxide definition layer below the polysilicon layer; and
   a first metal layer connected to the polysilicon layer and the oxide definition layer; and
   a patterned shielding structure disposed over the MOSCAP structure and comprises a second metal layer,
   wherein the first metal layer comprises a first conductive component and at least one second conductive component,
   wherein the first conductive component is connected to the polysilicon layer through a first connection via, and the at least one second conductive component is connected to the oxide definition layer through a second connection via and connected to the second metal layer of the patterned shielding structure through a third connection via,
   wherein the first conductive component receives a positive voltage, and the second metal layer of the patterned shielding structure receives a ground voltage.

2. The semiconductor device of claim 1, wherein the at least one second conductive component is H-shaped.

3. The semiconductor device of claim 1, wherein a first projection area, on a plane, of the first conductive component is within a second projection area, on the plane, of the second metal layer.

4. The semiconductor device of claim 3, wherein the first projection area is less than the second projection area.

5. The semiconductor device of claim 1, wherein the at least one second conductive component comprises:
   a first conductive segment connected to the oxide definition layer through the second connection via;
   a second conductive segment connected to the second metal layer through the third connection via; and
   a third conductive segment connected to the first conductive segment and the second conductive segment, wherein the first conductive segment is parallel to the second conductive segment.

6. The semiconductor device of claim 5, wherein the third conductive segment is perpendicular to first conductive segment and the second conductive segment.

7. The semiconductor device of claim 1, wherein a first connection direction of a plurality of the first connection vias is perpendicular to a second connection direction of a plurality of the second connection vias.

8. The semiconductor device of claim 7, wherein the first connection direction is perpendicular to a third connection direction of a plurality of the third connection vias.

9. The semiconductor device of claim 1, wherein a plurality of the second connection vias are disposed at two sides of the polysilicon layer.

10. The semiconductor device of claim 1, wherein voltage levels of the oxide definition layer, the at least one of the second conductive component of the first metal layer, and the second metal layer are the same.

11. The semiconductor device of claim 1, wherein the semiconductor device comprises two second conductive components.

12. The semiconductor device of claim 1, wherein the at least one second conductive component is rectangular.

13. A MOSCAP structure disposed below a patterned shielding structure, wherein the MOSCAP structure comprises:
- a polysilicon layer;
- an oxide definition layer below the polysilicon layer; and
- a first metal layer connected to the polysilicon layer through a first connection via and connected to the oxide definition layer through a second connection via, wherein the patterned shielding structure comprises a second metal layer, and the first metal layer is connected to the second metal layer through a third connection via,
- wherein the first metal layer comprises a first conductive component and at least one second conductive component,
- wherein the first conductive component is connected to the polysilicon layer through the first connection via, and the at least one second conductive component is connected to the oxide definition layer through the second connection via and connected to the second metal layer of the patterned shielding structure through the third connection via,
- wherein the first conductive component receives a positive voltage, and the second metal layer of the patterned shielding structure receives a ground voltage.

* * * * *